United States Patent
Koo et al.

(10) Patent No.: US 11,978,626 B2
(45) Date of Patent: May 7, 2024

(54) METHOD OF TREATING TARGET FILM AND METHOD OF MANUFACTURING SEMICONDUCTOR DEVICE

(71) Applicant: SK hynix Inc., Gyeonggi-do (KR)

(72) Inventors: Won Tae Koo, Gyeonggi-do (KR); Mir Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/546,617

(22) Filed: Dec. 9, 2021

(65) Prior Publication Data
US 2023/0005742 A1    Jan. 5, 2023

(30) Foreign Application Priority Data
Jun. 30, 2021    (KR) .................. 10-2021-0086124

(51) Int. Cl.
*H01L 21/02*    (2006.01)

(52) U.S. Cl.
CPC .. *H01L 21/02356* (2013.01); *H01L 21/02354* (2013.01)

(58) Field of Classification Search
CPC ........ H01L 21/02356; H01L 21/02354; H10B 12/31–318
See application file for complete search history.

(56) References Cited

U.S. PATENT DOCUMENTS

| 9,761,344 B2 | 9/2017 | Yoon et al. | |
| 2002/0072191 A1* | 6/2002 | Aoki | H01L 21/02197 |
| | | | 257/E21.272 |
| 2008/0102201 A1* | 5/2008 | Choi | B22F 1/145 |
| | | | 977/773 |
| 2013/0075377 A1 | 3/2013 | Cheng et al. | |
| 2019/0096767 A1* | 3/2019 | Yeh | H01L 21/823462 |
| 2020/0025981 A1* | 1/2020 | Greer | B82Y 20/00 |

OTHER PUBLICATIONS

Wang J, Lin X, Shu T, Su L, Liang F, Zhang X. Self-Assembly of Metal Nanoclusters for Aggregation-Induced Emission. Int J Mol Sci. Apr. 17, 2019;20(8): 1891. doi: 10.3390/ijms20081891. PMID: 30999556; PMCID: PMC6515624.*

Wang et al. Self-Assembly of Metal Nanoclusters for Aggregation-Induced Emission. Int J Mol Sci. Apr. 17, 2019;20(8):1891. doi: 10.3390/ijms20081891. PMID: 30999556; PMCID: PMC6515624.*

* cited by examiner

*Primary Examiner* — Matthew L Reames
*Assistant Examiner* — Fakeha Sehar
(74) *Attorney, Agent, or Firm* — IP & T GROUP LLP

(57) ABSTRACT

In a method of treating a target film, a plurality of pattern structures with sidewall surfaces facing each other are provided. A target film is formed on the sidewalls of the plurality of pattern structures. A plurality of nanoparticles are distributed on the target thin film. The target thin film is thermally treated by irradiating laser light from upper sides of the plurality of pattern structures to the target thin film. The irradiated laser light is scattered from the plurality of nanoparticles.

14 Claims, 23 Drawing Sheets

METHOD OF TREATING TARGET FILM AND METHOD OF MANUFACTURING SEMICONDUCTOR DEVICE

CROSS-REFERENCE TO RELATED APPLICATIONS

The present application claims priority under 35 U.S.C. 119(a) to Korean Patent Application No. 10-2021-0086124, filed on Jun. 30, 2021, which is incorporated herein by reference in its entirety.

BACKGROUND

1. Technical Field

The present disclosure relates to a method of treating a target film and a method of manufacturing a semiconductor device using the same.

2. Related Art

Recently, in the field of semiconductor technology, various techniques have been tried for heat treatment for a thin film. The thermal treatment technology for a thin film can be classified into a traditional method using resistive heat generated in a coil of a thermal treatment furnace and a rapid thermal treatment method using a light source such as a lamp or laser.

Among them, the rapid thermal treatment method using a light source can uniformly transfer heat to a thin film in a short time. Accordingly, it is possible to provide a thin film of good quality by reducing a thermal budget that the thin film receives when thermal treatment is performed. In particular, in recent years, as the thickness of a thin film to be thermally treated continues to decrease, research on the rapid thermal treatment technique using a light source as a thermal treatment method for a thin film is being actively conducted.

SUMMARY

In a method of treating a target film according to an embodiment, a plurality of pattern structures with sidewall surfaces facing each other are provided. A target film is formed on the sidewalls of the plurality of pattern structures. A plurality of nanoparticles are distributed on the target film. The target film is thermally treated by irradiating laser light from upper sides of the plurality of pattern structures to the target film. The irradiated laser light is scattered from the plurality of nanoparticles.

In a method of manufacturing a semiconductor device according to another embodiment of the present disclosure, a plurality of pattern structures disposed on a substrate and having sidewall surfaces extending in a direction perpendicular to a surface of the substrate are provided. An amorphous dielectric layer is formed on at least the sidewall surfaces of the plurality of pattern structures. A plurality of metal particles are distributed on the amorphous dielectric layer. A first crystalline dielectric layer thermally treating the amorphous dielectric layer uses laser light. In thermally treating the amorphous dielectric layer, the laser light is irradiated onto the amorphous dielectric layer from upper sides of the plurality of pattern structures, wherein the irradiated laser light is scattered from the plurality of metal particles.

DETAILED DESCRIPTION

Figure 1:
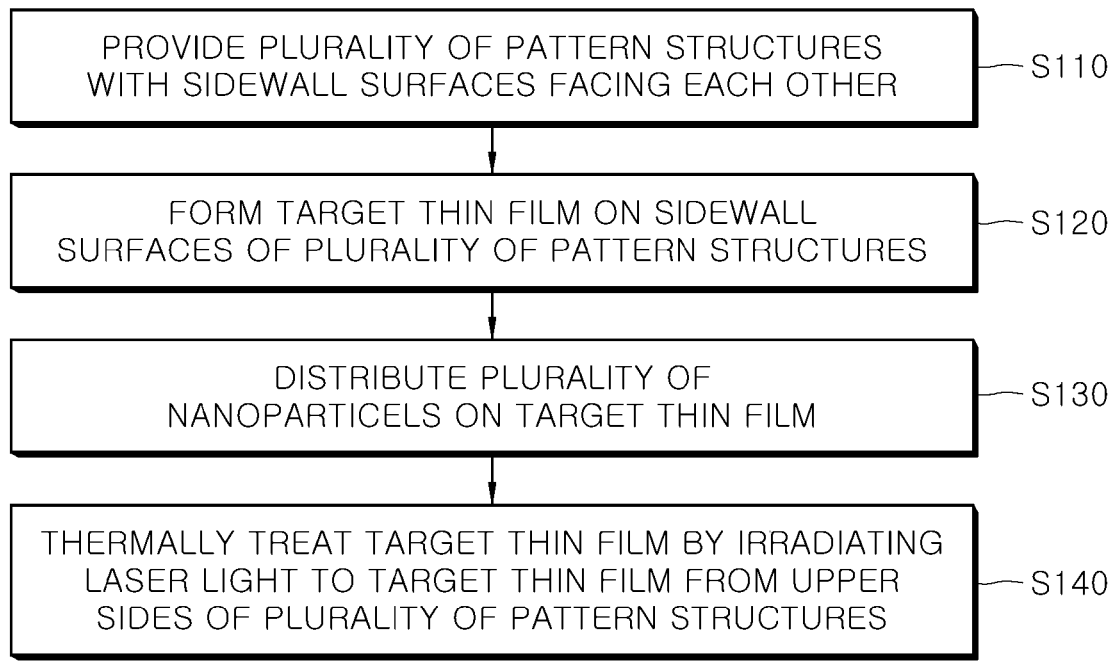
FIG. 1 is a schematic flowchart illustrating a thermal treatment method for a target film according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of including one or more other features, numbers, steps, operations, components, elements, parts, or combinations thereof.

Further, in performing a method or a manufacturing method, each process constituting the method can take place differently from the stipulated order unless a specific sequence is described explicitly in the context. As an example, each process may be performed in the same manner as stated order, and may be performed substantially at the same time. As another example, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

FIG. 1 is a schematic flowchart illustrating a thermal treatment method for a target film according to an embodiment of the present disclosure. FIGS. 2 to 6 are schematic cross-sectional views illustrating a thermal treatment method for a target film according to an embodiment of the present disclosure.

Figure 2:
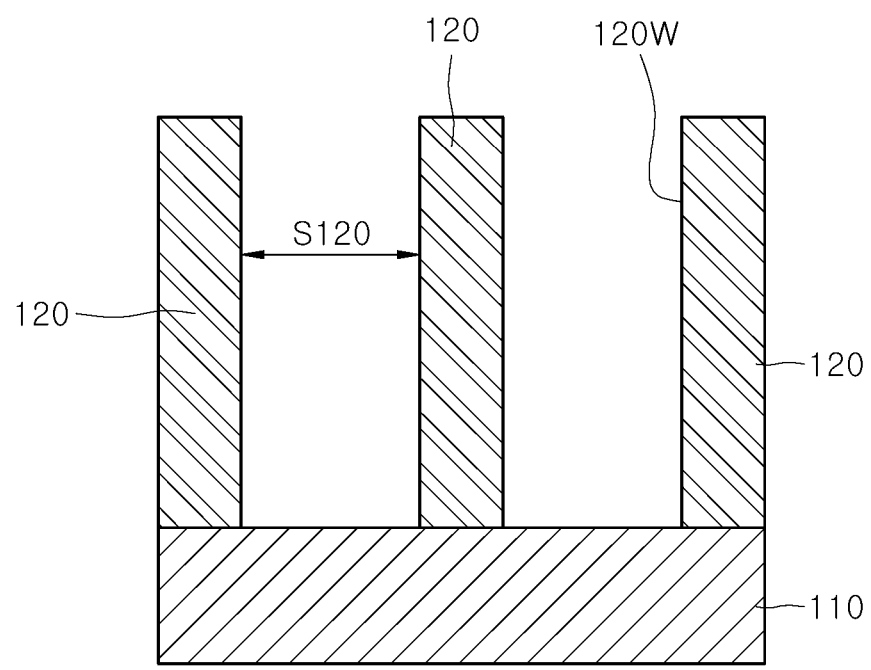
FIGS. 2 to 6 are schematic cross-sectional views illustrating a thermal treatment method for a target film according to an embodiment of the present disclosure.

Referring to S110 of FIG. 1, a plurality of pattern structures with sidewall surfaces facing each other is provided. Referring to FIG. 2 in connection with S110 of FIG. 1, a process of providing the plurality of pattern structures may include forming a plurality of pillar structures 120 that are spaced apart from each other at predetermined spaces on a support structure 110. The plurality of pillar structures 120 may be cylindrical columns, elliptical columns, or polygonal columns having sidewall surfaces 120W. According to an embodiment, each of the plurality of pillar structures 120 may be disposed with a space S120 of, for example, 20 nm to 100 nm from neighboring pillar structures.

Figure 3:
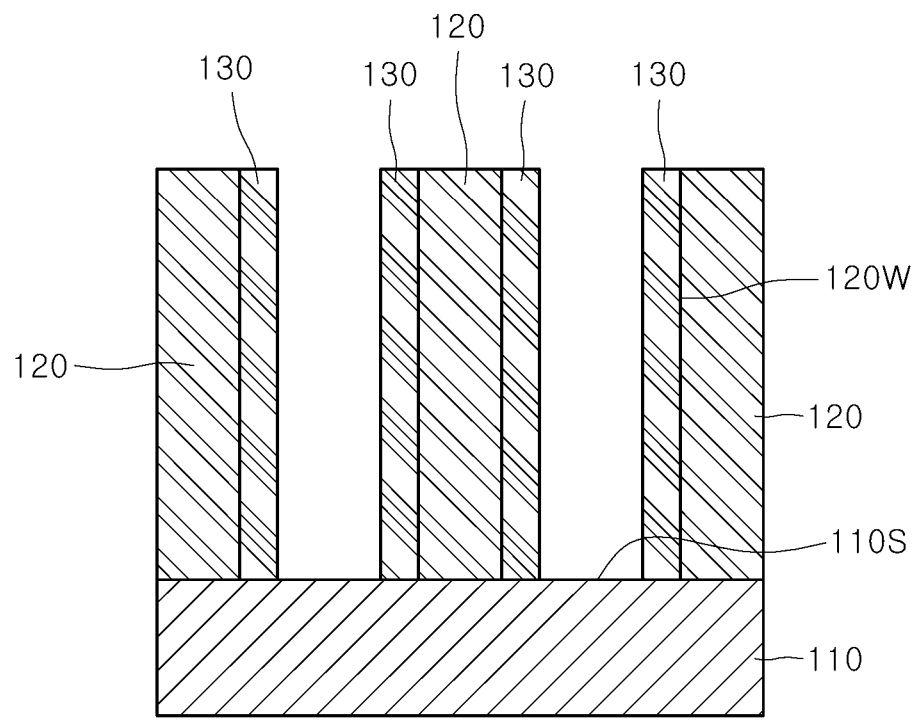

Referring to S120 of FIG. 1, a target film is formed on the sidewall surfaces of the plurality of pattern structures. In an embodiment, the target film may be a dielectric layer. Referring to FIG. 3 in connection with S120 of FIG. 1, a process of forming the target film may include forming an amorphous film as the target film 130 (see FIG. 3) on the sidewall surfaces 120W of the plurality of pillar structures 120 on the support structure 110. In an embodiment, the target film 130 may be an amorphous dielectric layer. The target film 130 may extend in a direction (i.e., the z-direction) perpendicular to a surface of the support structure 110.

Referring to S130 of FIG. 1, a plurality of nanoparticles are distributed on the target film. In connection with S130 of FIG. 1, a process of distributing the plurality of nanoparticles may include a process of depositing a metal film 140 illustrated in FIG. 4 and a self-aggregation process of the metal film 140 illustrated in FIG. 5.

Figure 4:
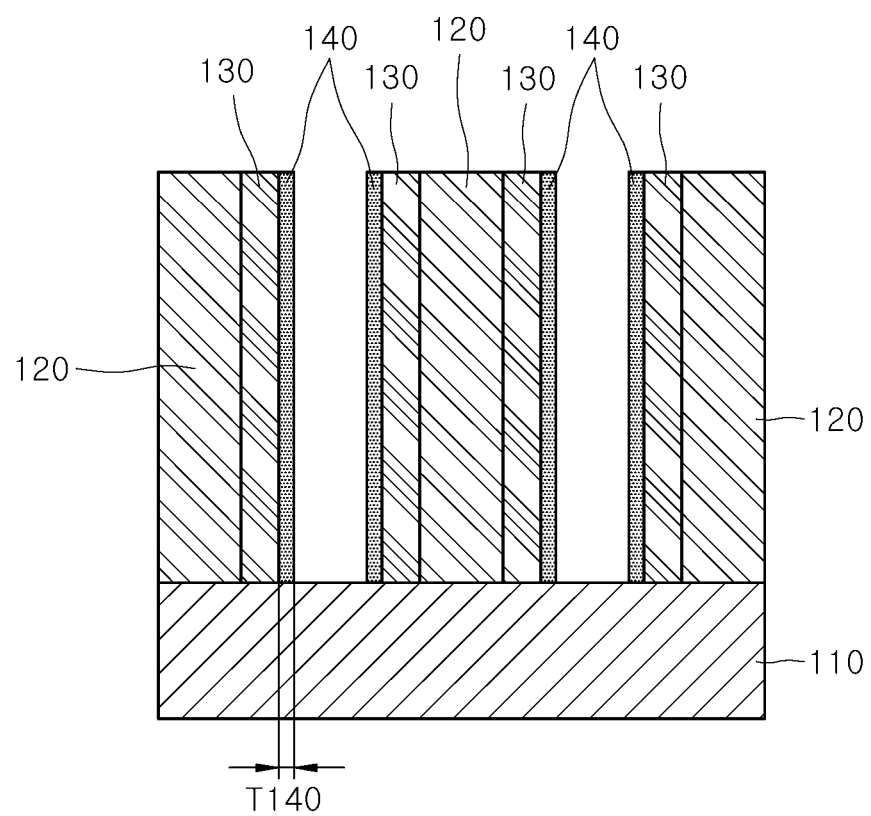

Referring to FIG. 4, the metal film 140 is formed on the target film 130 to have a thickness T140 of 0.1 nm to 1 nm. The metal film 140 may include, for example, gold (Au), platinum (Pt), ruthenium (Ru), tungsten (W), copper (Cu), magnesium (Mg), aluminum (Al), yttrium (Y), tin (Sn), strontium (Sr), lead (Pb), calcium (Ca), barium (Ba), titanium (Ti), gadolinium (Gd), lanthanum (La), or a combination thereof. The process of forming the metal film 140 may be performed using, for example, a physical vapor deposition method, a chemical vapor deposition method, an atomic layer deposition method, or the like.

Figure 5:
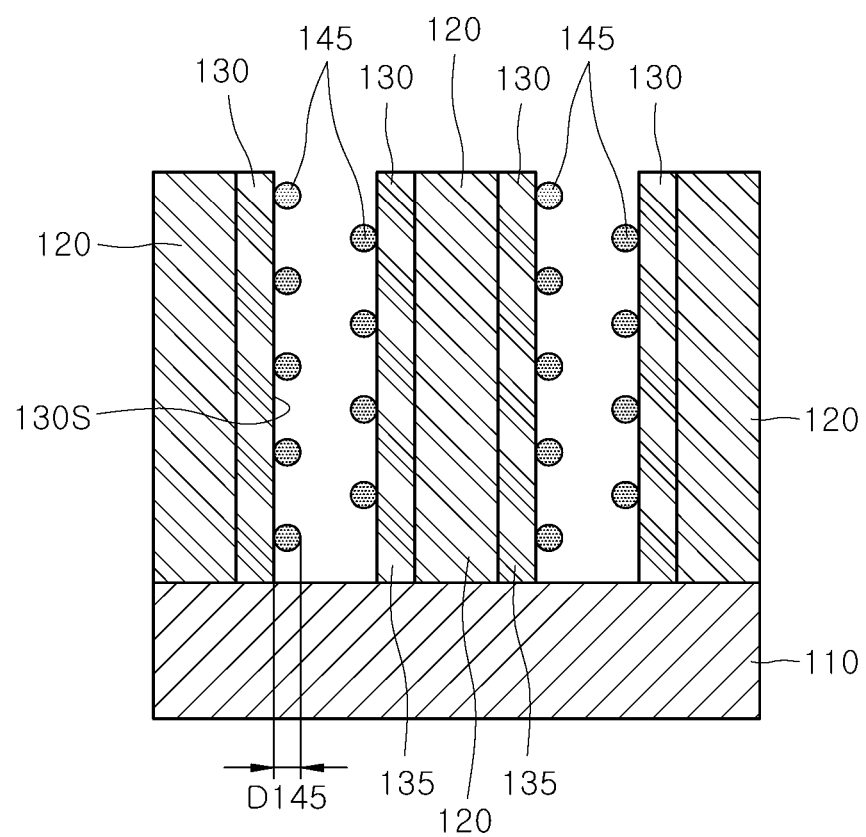

Referring to FIG. 5, the metal film 140 self-aggregates to form a plurality of nanoparticles 145 having a size D145 of 0.1 nm to 5 nm on a surface 130S of the target film 130. A self-aggregation of a metal film may occur to reduce the internal energy of the metal film when the metal film is formed to having a thin thickness lower than a critical thickness on a dielectric film. The self-aggregation of the metal film 140 may occur after the metal film 140 having a thin thickness T140 of 0.1 nm to 1 nm described above is formed on the target film 130. Alternatively, the self-aggregation of the metal film 140 may occur in the process of depositing the metal film 140 on the target film 130. In an embodiment, the plurality of nanoparticles 145 may be evenly distributed on the surface 130S. In some other embodiments, the plurality of nanoparticles 145 may be unevenly distributed on the surface 130S.

Referring to S140 of FIG. 1, the target film is thermally treated by irradiating laser light from upper sides of the plurality of pattern structures to the target film. In this case, the irradiated laser light may be scattered from the plurality of nanoparticles. The scattered laser light may reach the target film uniformly.

Figure 6:
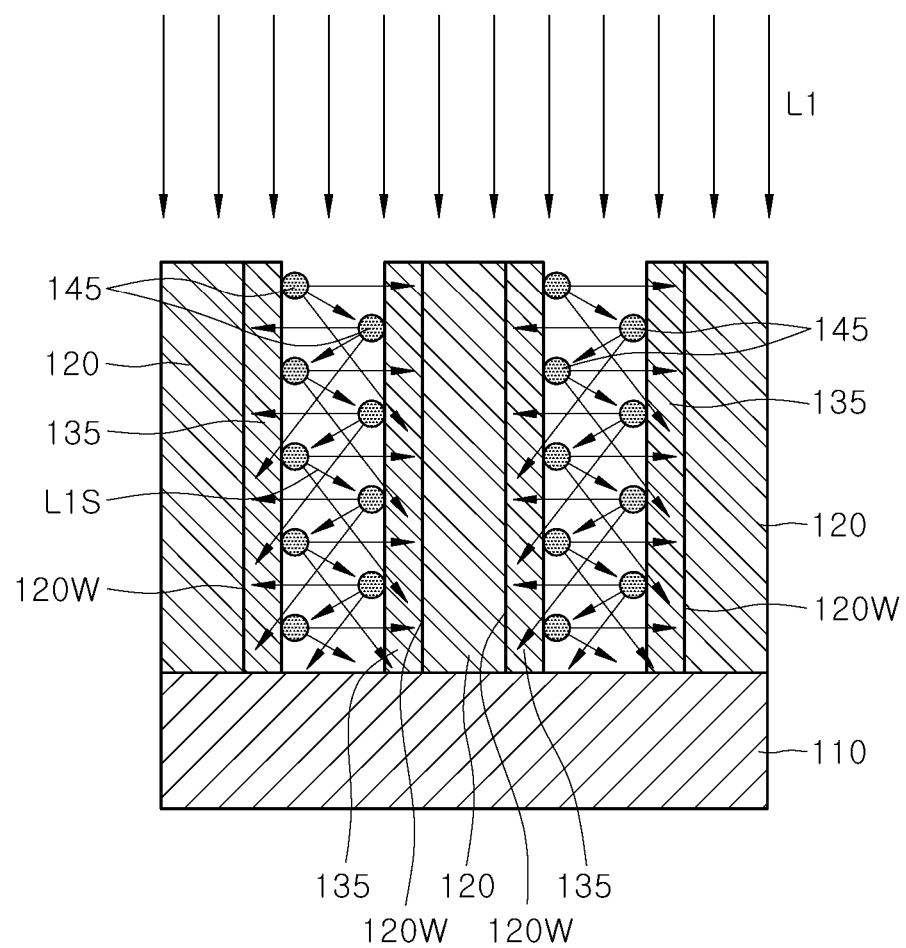

Referring to FIGS. 5 and 6 together in connection with S140 of FIG. 1, a thermally treated film 135 of FIG. 6 may be obtained by irradiating a laser light L1 to the target film 130 of FIG. 5 and performing thermal treatment. The process of irradiating the laser light L1 may include irradiating the laser light L1 in a direction (i.e., the z-direction) substantially parallel to the sidewall surfaces 120W of the plurality of pillar structures 120. The irradiated laser light L1 may be scattered after colliding with the plurality of nanoparticles 145 positioned on the target film 130 of FIG. 5.

According to an embodiment, a laser light L1S scattered from the plurality of nanoparticles 145 on the target film 130 positioned on the sidewall surface 120W of one pillar structure may reach the target film 130 disposed on the sidewall surface 120W of another pillar structure facing the one pillar structure. In addition, the scattered laser light L1S reaching the target film 130 may be scattered again after re-collision with the plurality of nanoparticles 145 disposed on the target film 130. As such, the scattering of the laser light may repeatedly occur between the sidewall surfaces 120W of the plurality of pillar structures 120. As a result, the scattered laser light L1S may thermally treat the target film 130 while reciprocating between the sidewall surfaces 120W of the plurality of pillar structures 120.

In addition, the laser light L1 and the scattered laser light L1S may proceed into the target film 130 after being incident on the target film 130. Laser lights that proceed into the target film 130 may thermally treat the target film 130.

As described above, by thermally treating the target film 130 using the laser light L1 and the scattered laser light L1S, the thermally treated film 135 illustrated in FIG. 6 may be obtained. The thermal treatment method for the target film 130 according to an embodiment of the present disclosure may be applied to a method of manufacturing a semiconductor device including a crystalline film, as described below.

FIGS. 7 to 13 are schematic views illustrating a method of manufacturing a semiconductor device according to an embodiment of the present disclosure. In an embodiment, the semiconductor device manufactured by the method may be a capacitor element of a memory device.

Figure 7:
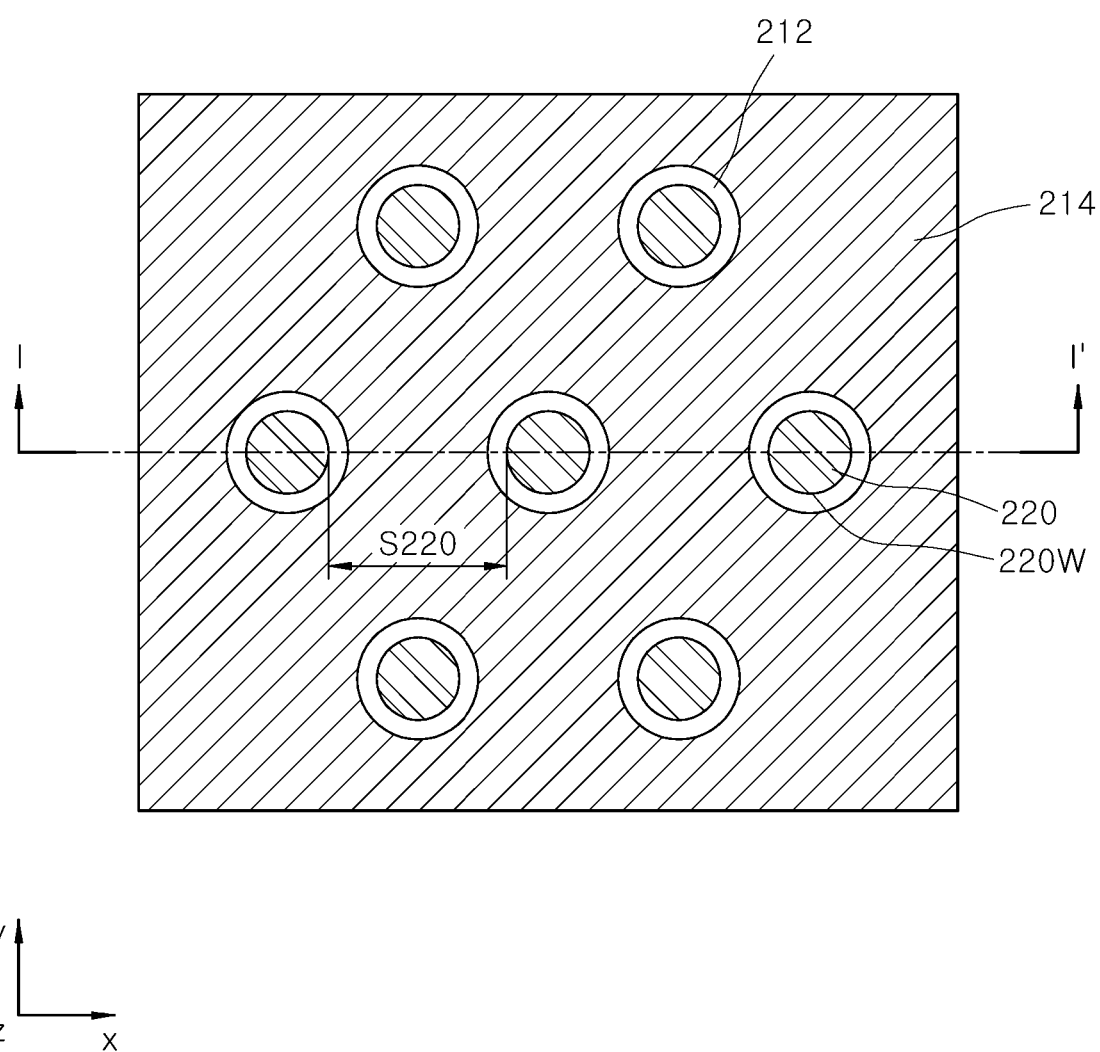
FIGS. 7 to 13 are schematic views illustrating a method of manufacturing a semiconductor device according to an embodiment of the present disclosure.
Figure 8:
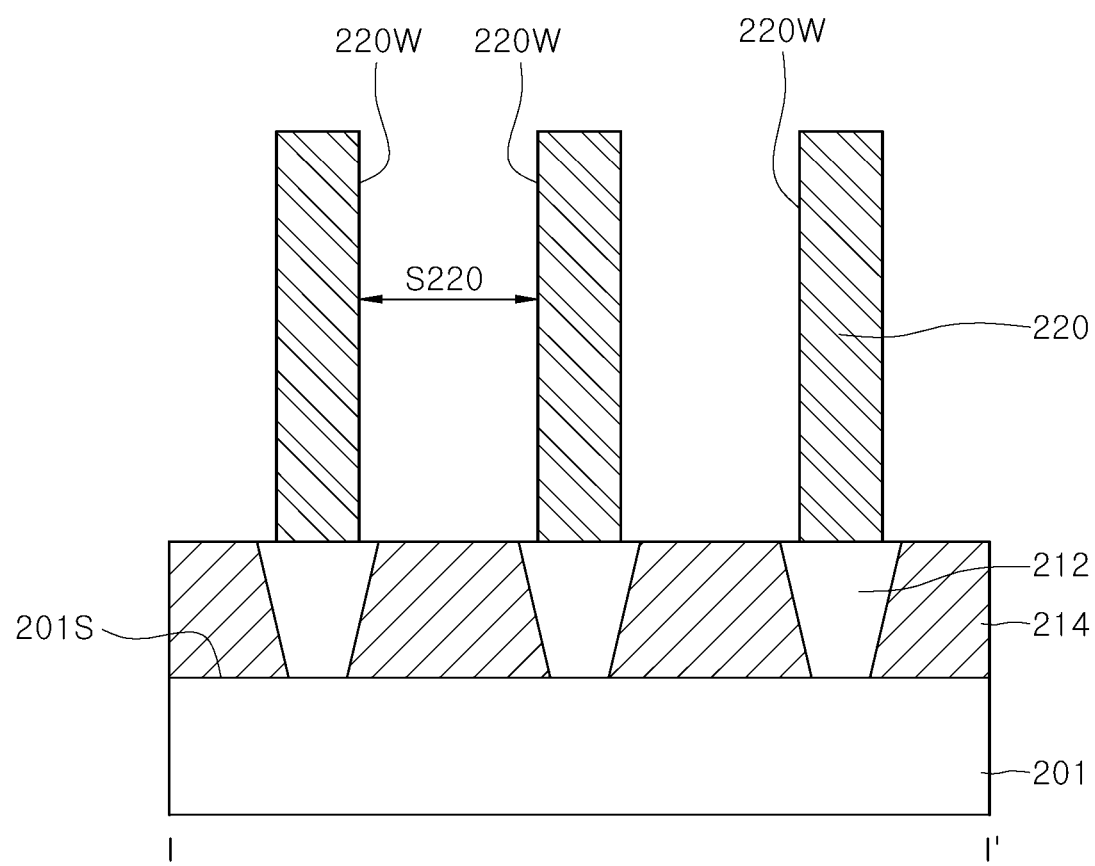

FIG. 7 is a schematic plan view illustrating a substrate (201 of FIG. 8) on which a plurality of pattern structures 220 are formed according to an embodiment of the present disclosure. FIG. 8 is a cross-sectional view taken along the line I-I' of FIG. 7. The method described with reference to FIGS. 9 to 13 may be performed on the substrate 201 including the plurality of pattern structures 220 illustrated in FIGS. 7 and 8.

Referring to FIGS. 7 and 8, the substrate 201 is provided. The substrate 201 may be a semiconductor substrate on which an integrated circuit process may be performed. A plurality of contact plugs 212 spaced apart from each other and an interlayer insulating layer 214 may be formed on the substrate 201. The plurality of contact plugs 212 may be electrically connected to a doped well region (not illustrated) of the substrate 201.

Although not illustrated, a cell transistor including a gate electrode, a source region, and a drain region may be disposed on the substrate 201. The source region of the cell transistor may be electrically connected to a bit line, and the drain region may be connected to a corresponding contact plug 212. The cell transistor may be turned on by a voltage applied to the gate electrode from the word line, and the source region and the drain region may be electrically connected to each other.

The plurality of pattern structures 220 may be disposed on the plurality of contact plugs 212. The plurality of pattern structures 220 may have shapes of a plurality of conductive pillar structures. The plurality of pattern structures 220 may have sidewall surfaces 220W extending in a direction substantially perpendicular to the surface 201S of the substrate 201 (i.e., the z-direction). In this case, the extension of the sidewall surfaces 220W in the direction substantially perpendicular to the surface 201S of the substrate 201 may mean that the sidewall surfaces 220W are perpendicular to the surface 201S of the substrate 201 or form an inclination angle of 30° or less with the surface perpendicular to the surface 201S of the substrate 201.

In an embodiment, the plurality of pattern structures 220 may be a plurality of storage node electrodes spaced apart from each other in a direction parallel to the surface 201S of the substrate 201, on the substrate 201. The plurality of pattern structures 220 may be electrically connected to the corresponding contact plugs 212.

In an embodiment, the plurality of pattern structures 220 may include doped semiconductor, metal, conductive metal silicide, conductive metal nitride, or the like. As an example, the plurality of pattern structures 220 may include doped silicon, tungsten (W), titanium (Ti), tantalum (Ta), tungsten silicide, titanium silicide, titanium nitride, tantalum nitride, tungsten nitride, or the like.

In an embodiment, the sidewall surface 220W of one pattern structure among the plurality of pattern structures 220 may be disposed with a space S220 of 20 nm to 100 nm from the sidewall surface 220W of another adjacent pattern structure.

Figure 9:
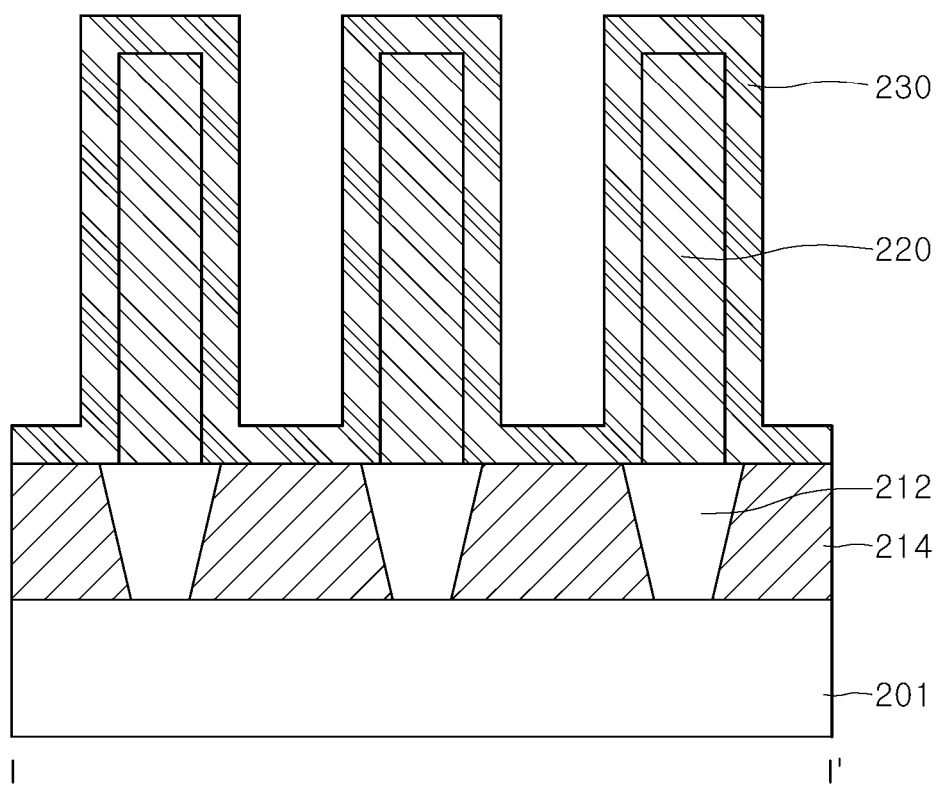

Referring to FIG. 9, an amorphous dielectric layer 230 is formed on at least the sidewall surfaces 220W of the plurality of pattern structures 220. In an embodiment, the amorphous dielectric layer 230 may be disposed to surround the plurality of pattern structures 220 in the form of the conductive pillar structures on the interlayer insulating layer 214.

The amorphous dielectric layer 230 may include a paraelectric material, a ferroelectric material, an anti-ferroelectric material, or a combination of two or more thereof. The paraelectric material, the ferroelectric material, and the anti-ferroelectric material may exhibit stable paraelectricity, ferroelectricity, and anti-ferroelectricity, respectively, through crystallization, which will be described later.

The amorphous dielectric layer 230 may include, for example, silicon oxide, silicon nitride, silicon oxynitride, aluminum oxide, hafnium oxide, zirconium oxide, hafnium zirconium oxide, or a combination of two or more thereof. The amorphous dielectric layer 230 may be formed using, for example, a chemical vapor deposition method or an atomic layer deposition method.

Figure 10:
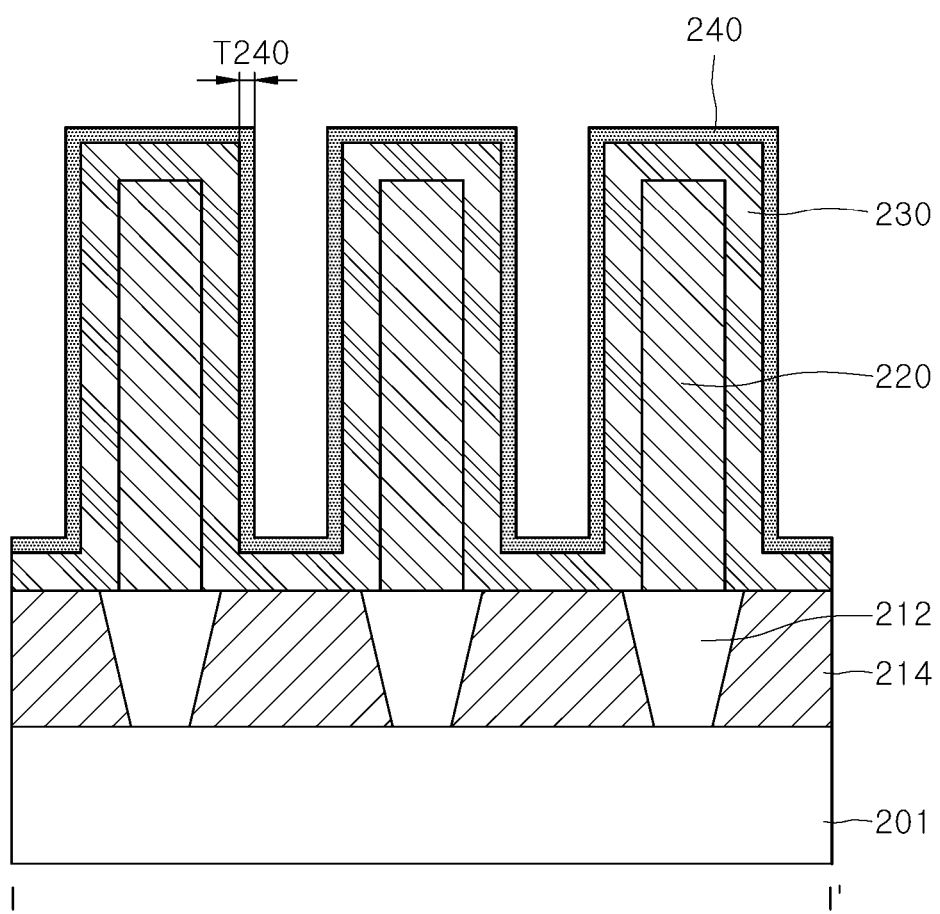

Referring to FIG. 10, a metal film 240 is formed on the amorphous dielectric layer 230. As an example, the metal film 240 may be formed to have a thickness T240 of 0.1 nm to 1 nm. The metal film 240 may be formed using, for example, a chemical vapor deposition method or an atomic layer deposition method. The metal film 240 may include, for example, gold (Au), platinum (Pt), ruthenium (Ru), tungsten (W), copper (Cu), magnesium (Mg), aluminum (Al), yttrium (Y), tin (Sn), strontium (Sr), lead (Pb), calcium (Ca), barium (Ba), titanium (Ti), gadolinium (Gd), lanthanum (La), or a combination thereof.

Figure 11:
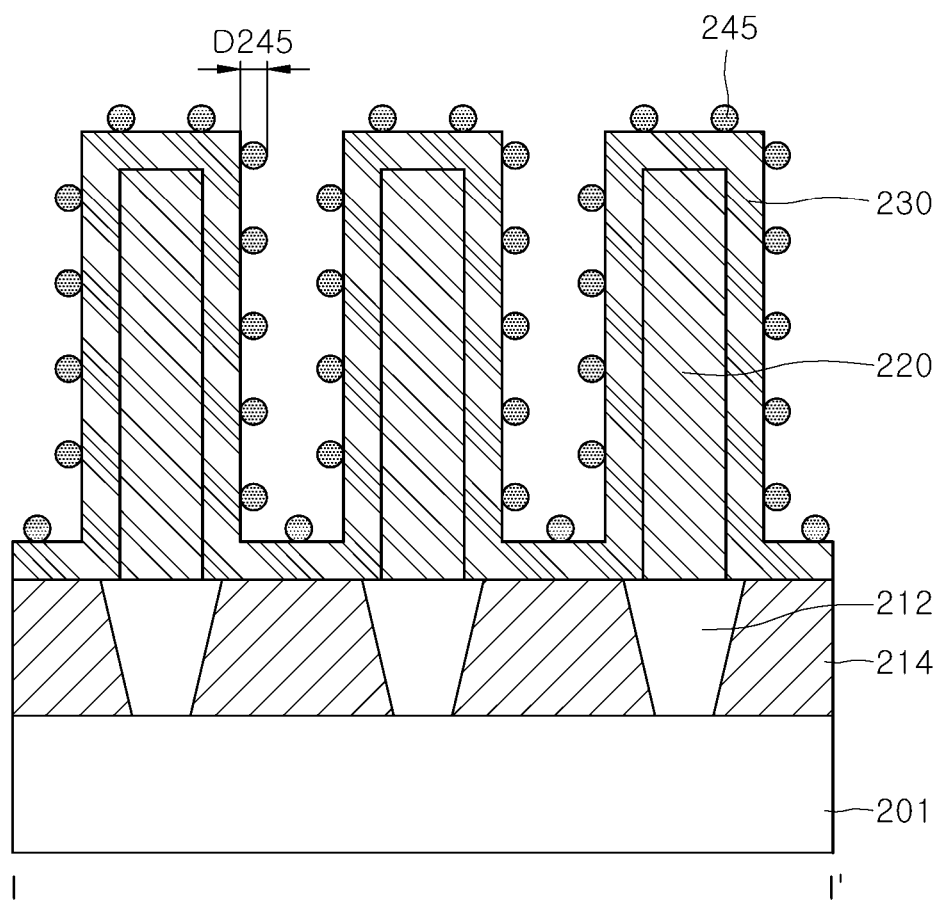

Referring to FIG. 11, the metal film 240 self-aggregates to form a plurality of metal particles 245. The plurality of metal particles 245 may be distributed on the amorphous dielectric layer 230. The plurality of metal particles 245 may have, for example, a size D245 of 0.1 nm to 5 nm.

The self-aggregation of the metal film 240 may occur to reduce the internal energy of the metal film 240, after the metal film 240 having a thin thickness T240 of 0.1 nm to 1 nm is formed on the amorphous dielectric layer 230. Alternatively, the self-aggregation of the metal film 240 may occur while the metal film 240 of the thin thickness T240 is aggregated to reduce the internal energy of the deposited metal film 240 in the process of being deposited on the amorphous dielectric layer 230.

Figure 12:
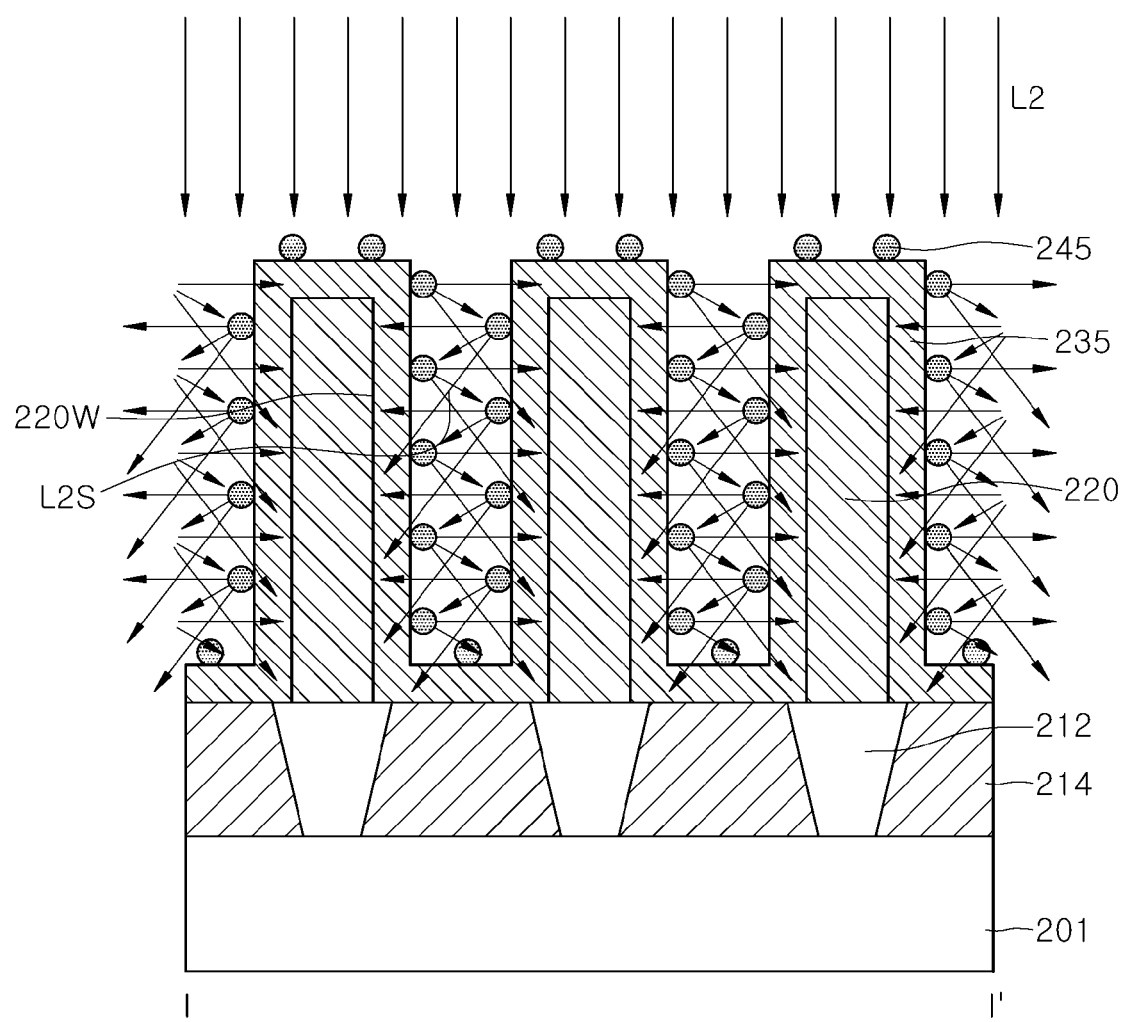

Referring to FIG. 12, the amorphous dielectric layer 230 of FIG. 11 is thermally-treated using laser light L2 to form a crystalline dielectric layer 235. In an embodiment, the thermal treatment of the amorphous dielectric layer 230 may be performed by irradiating laser light L2 onto the amorphous dielectric layer 230 from an upper side of the plurality of pattern structures 220 and allowing the irradiated laser light L2 to be scattered from the plurality of metal particles 245.

In an embodiment, the process of irradiating the laser light L2 may include irradiating the laser light L2 in a direction substantially parallel to the sidewall surfaces 220W of the plurality of pattern structures 220. In an embodiment, the process of irradiating the laser light L2 may include a process in which laser light L2S scattered from the plurality of metal particles 245 on the amorphous dielectric layer 230 positioned on the sidewall surface 220W of one pattern structure reaches the amorphous dielectric layer 230 positioned on the sidewall surface 220W of another pattern structure facing the one pattern structure.

The thermal treatment process using the laser light L2 and the scattered laser light L2S may be substantially the same as the thermal treatment process of the target film 130 described with reference to FIG. 6. Through the thermal treatment process, the amorphous dielectric layer 230 may be crystallized to form the crystalline dielectric layer 235.

Figure 13:
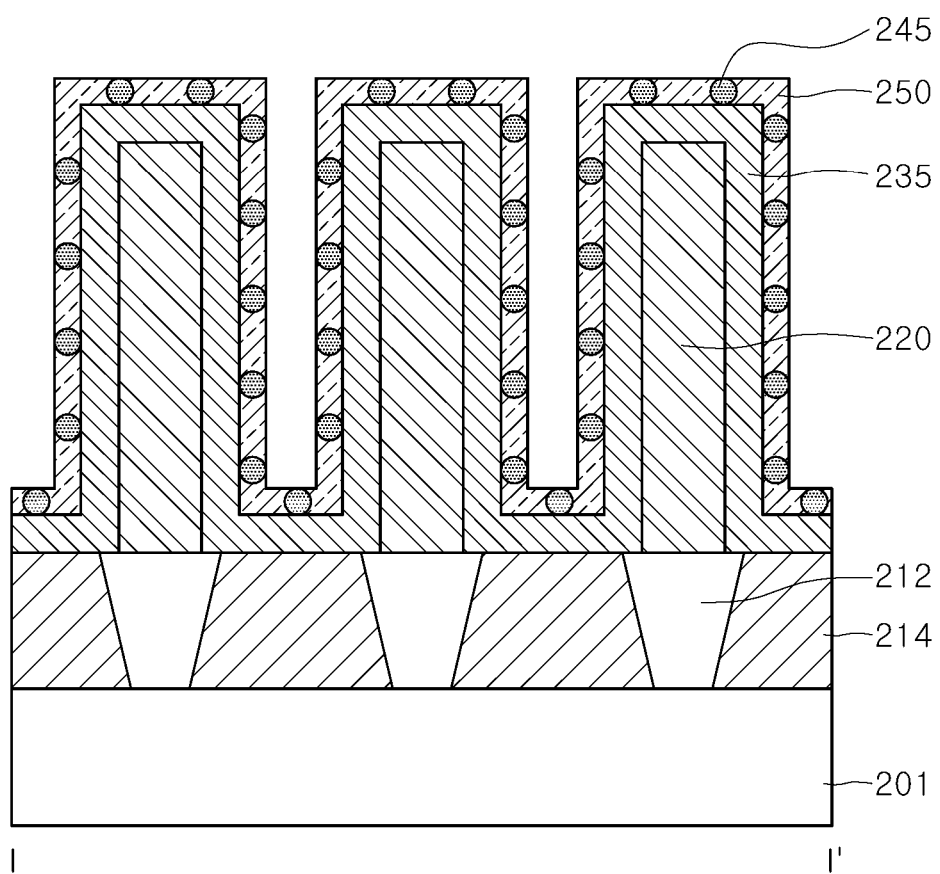
Figure 13:
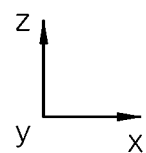

Referring to FIG. 13, a conductive layer 250 is formed on the crystalline dielectric layer 235 on which the plurality of metal particles 245 are formed. The conductive layer 250 may be formed to cover the plurality of metal particles 245 on the crystalline dielectric layer 235. The conductive layer 250 may include, for example, doped semiconductor, metal, conductive metal silicide, conductive metal nitride, or the like. As a specific example, the conductive layer 250 may include doped silicon (Si), tungsten (W), titanium (Ti), tantalum (Ta), tungsten silicide, titanium silicide, titanium nitride, tantalum nitride, tungsten nitride, or the like. The conductive layer 250 may be formed using, for example, a chemical vapor deposition method, a physical vapor deposition method, an atomic layer deposition method, or the like.

A semiconductor device according to an embodiment of the present disclosure may be manufactured by applying the above-described method. The semiconductor device may be a capacitor element including the plurality of pattern structures 220 as storage node electrodes, the crystalline dielectric layer 235 as a capacitor dielectric layer, and the plurality of metal particles 245 and the conductive layer 250 as plate electrodes.

In an embodiment, the crystalline dielectric layer 235 may include at least one of a paraelectric layer, a ferroelectric layer, and an anti-ferroelectric layer. When the crystalline dielectric layer 235 has paraelectricity, the capacitor element may be applied to a volatile memory device. When the crystalline dielectric layer 235 has ferroelectricity, the capacitor element may be applied to a ferroelectric memory device. The ferroelectric memory device may include, for example, a ferroelectric capacitor, a ferroelectric field effect transistor, a NAND-type ferroelectric transistor memory cell, or the like.

Figure 14:
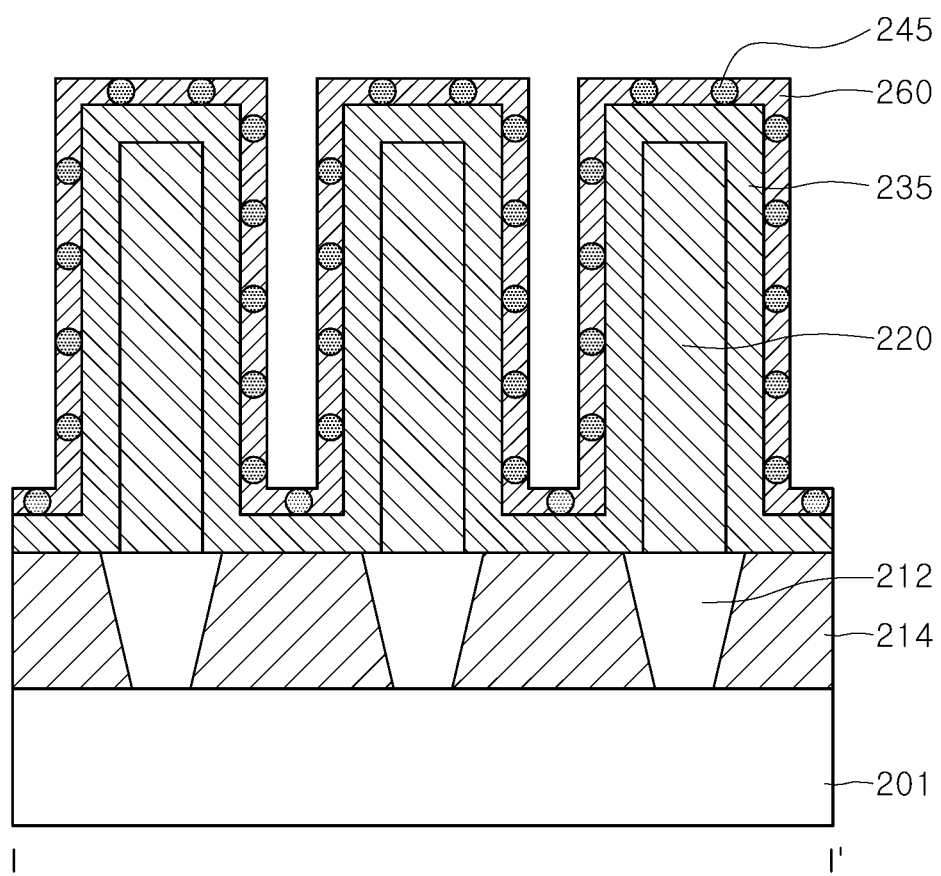
FIGS. 14 and 15 are schematic views illustrating a method of manufacturing a semiconductor device according to another embodiment of the present disclosure.
Figure 15:
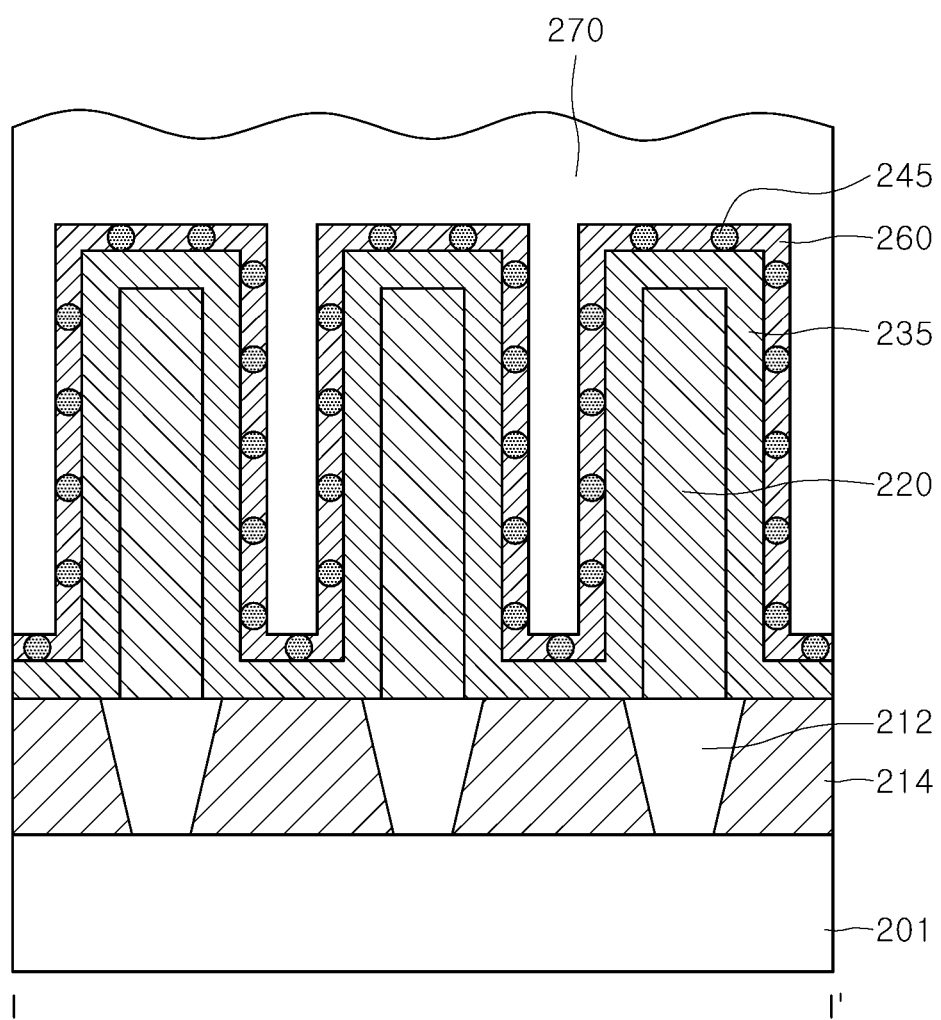

FIGS. 14 and 15 are schematic views illustrating a method of manufacturing a semiconductor device according to another embodiment of the present disclosure. First, the manufacturing method described with reference to FIGS. 7 to 12 may be performed. Accordingly, a plurality of pattern structures 220 may be disposed on a substrate 201 to be spaced apart from each other. In addition, a crystalline dielectric layer 235 may be disposed on the plurality of pattern structures 220, and a plurality of metal particles 245 may be disposed on the crystalline dielectric layer 235.

Referring to FIG. 14, an upper dielectric layer 260 may be additionally formed on the crystalline dielectric layer 235 on which the plurality of metal particles 245 are formed. The upper dielectric layer 260 may be formed of crystalline material. Hereinafter, for convenience of description, the crystalline dielectric layer 235 will be referred to as "a first crystalline dielectric layer", and the upper dielectric layer 260 will be referred to as "a second crystalline dielectric layer".

The second crystalline dielectric layer 260 may be deposited in a crystalline state using the first crystalline dielectric layer 235 as a crystallization seed layer. The second crystalline dielectric layer 260 may be formed by applying, for example, an atomic layer deposition method or a chemical vapor deposition method. The second crystalline dielectric layer 260 may include, for example, a paraelectric material, a ferroelectric material, an anti-ferroelectric material, or a combination of two or more thereof. In an embodiment, because the second crystalline dielectric layer 260 is deposited in a crystalline state, the crystallization thermal treatment may be omitted, unlike the first crystalline dielectric layer 235.

Referring to FIG. 15, a conductive layer 270 is formed on the second crystalline dielectric layer 260. The conductive layer 270 may include, for example, doped semiconductor, metal, conductive metal silicide, conductive metal nitride, or the like. As a specific example, the conductive layer 270 may include doped silicon (Si), tungsten (W), titanium (Ti), tantalum (Ta), tungsten silicide, titanium silicide, titanium nitride, tantalum nitride, tungsten nitride, or the like. The conductive layer 270 may be formed using, for example, a chemical vapor deposition method, a physical vapor deposition method, an atomic layer deposition method, or the like.

Through the above-described manufacturing method, the semiconductor device according to an embodiment of the present disclosure may be manufactured. In the manufactured semiconductor device, the plurality of metal particles 245 may be located inside the second crystalline dielectric layer 260. The plurality of metal particles 245 may apply a strain that causes lattice deformation to the second crystalline dielectric layer 260. The strain may increase the polarization of the second crystalline dielectric layer 260 and improve the permittivity of the second crystalline dielectric layer 260 by the flexoelectricity effect. In addition, the strain may increase the polarization switching speed of the second crystalline dielectric layer 260 during operation of the semiconductor device.

In an embodiment, when the second crystalline dielectric layer 260 is a ferroelectric layer, the strain applied by the plurality of metal particles 245 to the crystal lattice of the second crystalline dielectric layer 260 may enhance the ferroelectricity of the second crystalline dielectric layer 260 by the flexoelectricity effect.

In an embodiment, the first crystalline dielectric layer 235 may have ferroelectricity, and the second crystalline dielectric layer 260 may have paraelectricity. By controlling the first crystalline dielectric layer 235 to have a negative capacitance and the second crystalline dielectric layer 260 to have a positive capacitance, a capacitor element having a high capacitance between the storage node electrode 220 and the plate electrode 270 may be manufactured. The capacitor element may be applied to a volatile memory device.

In another embodiment, both the first crystalline dielectric layer 235 and the second crystalline dielectric layer 260 may have ferroelectricity. Accordingly, a capacitor element having ferroelectricity between the storage node electrode 220 and the plate electrode 270 may be manufactured. The capacitor element may be applied to a ferroelectric memory device. The ferroelectric memory device may include, for example, a ferroelectric capacitor, a ferroelectric field effect transistor, a NAND-type ferroelectric transistor memory cell, or the like.

In another embodiment, both the first crystalline dielectric layer 235 and the second crystalline dielectric layer 260 may have paraelectricity. The first crystalline dielectric layer 235 and the second crystalline dielectric layer 260 may be applied to a capacitor element of a volatile memory device.

FIGS. 16 to 23 are schematic views illustrating a method of manufacturing a semiconductor device according to another embodiment of the present disclosure. In an embodiment, the semiconductor device manufactured by the manufacturing method may be a capacitor element of a memory device.

Figure 16:
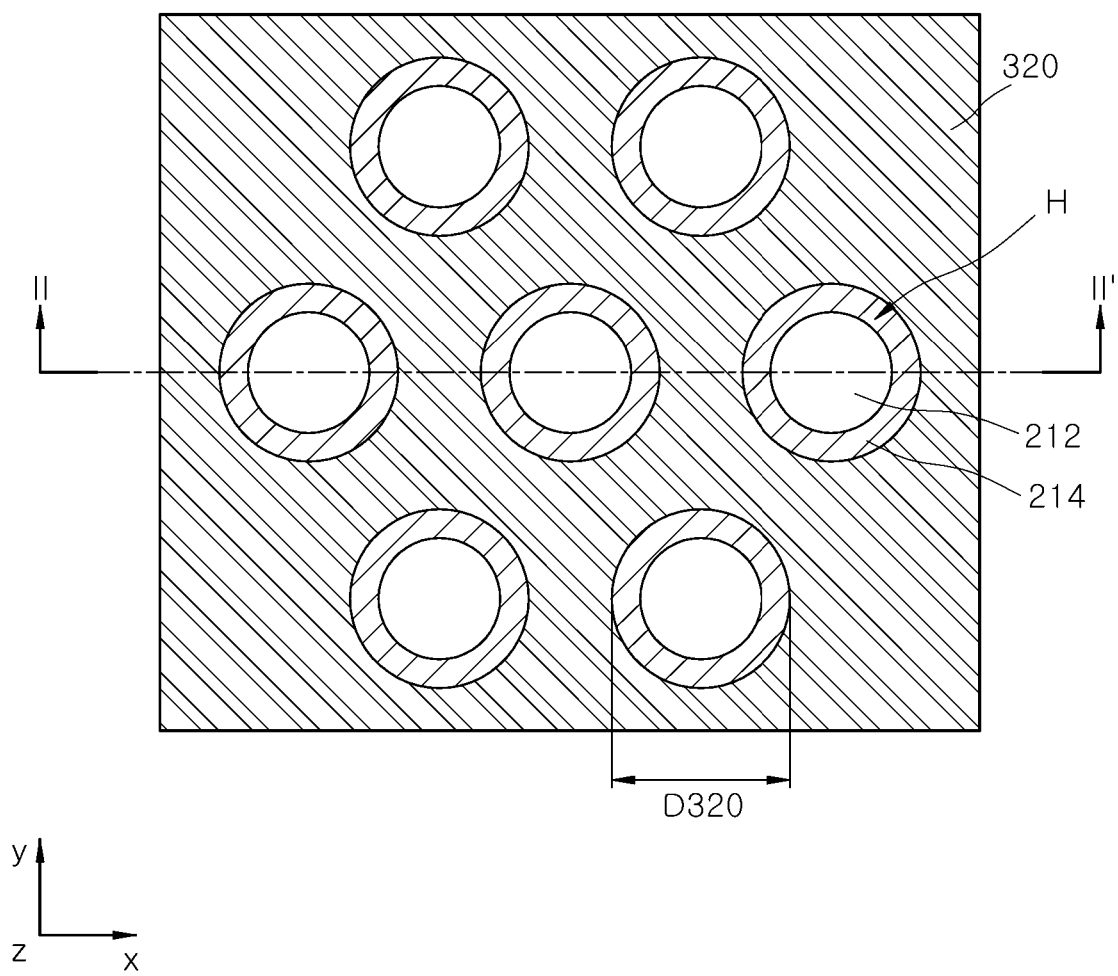
FIGS. 16 to 23 are schematic views illustrating a method of manufacturing a semiconductor device according to another embodiment of the present disclosure.
Figure 17:
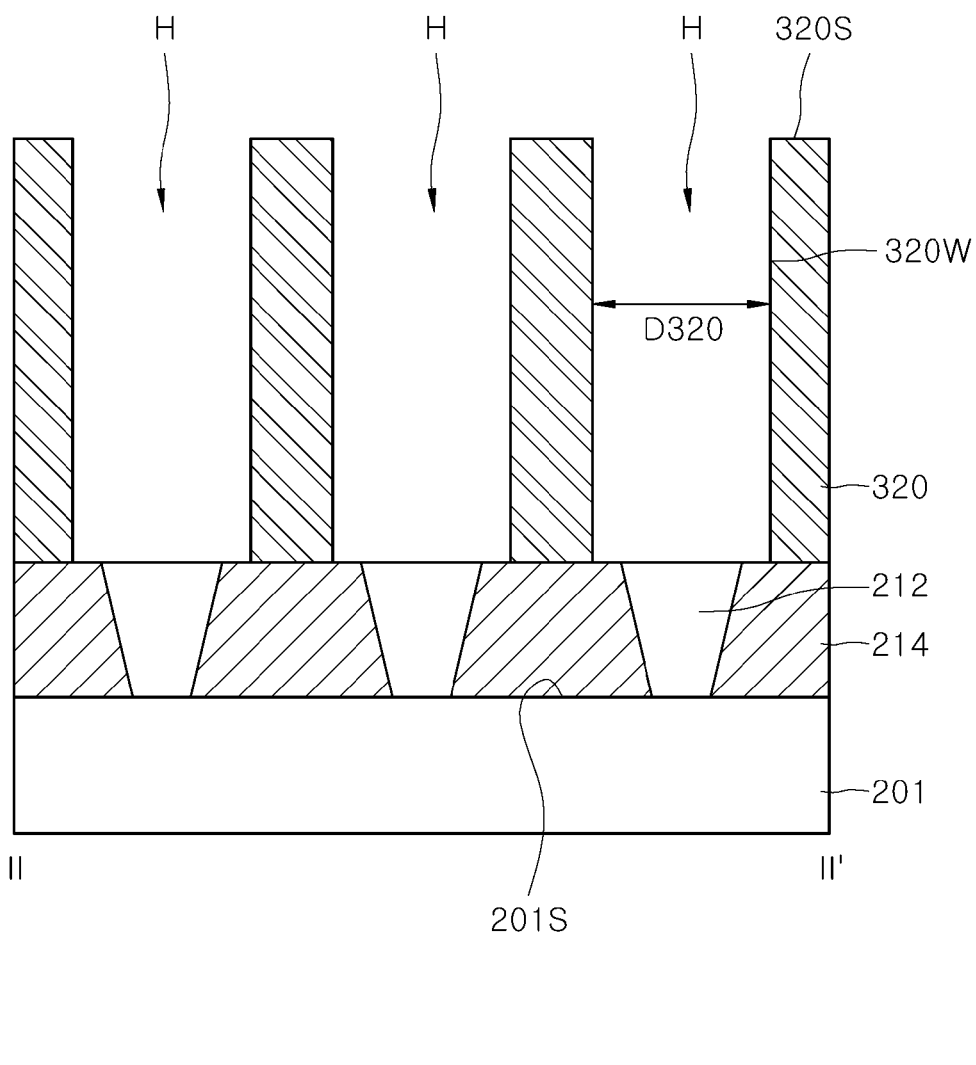

FIG. 16 is a schematic plan view illustrating a substrate (201 of FIG. 17) on which a plurality of pattern structures 320 are formed according to another embodiment of the present disclosure. FIG. 17 is a cross-sectional view taken along line II-II' of FIG. 16. The manufacturing method described with reference to FIGS. 18 to 23 may be performed on the substrate 201 including the plurality of pattern structures 320 illustrated in FIGS. 16 and 17.

Referring to FIGS. 16 and 17, a substrate 201 is provided. A plurality of contact plugs 212 spaced apart from each other and an interlayer insulating layer 214 are formed on the substrate 201. The plurality of contact plugs 212 may be electrically connected to a doped well region (not illustrated) of the substrate 201.

The plurality of pattern structures 320 may be disposed on the plurality of contact plugs 212 and the interlayer insulating layer 214. The plurality of pattern structures 320 may be an insulating layer having a plurality of hole patterns H. The insulating layer may include, for example, oxide, nitride, oxynitride, or a combination of two or more thereof. The plurality of hole patterns H may expose at least a part of each of the plurality of contact plugs 212. Each of the plurality of hole patterns H may have a diameter of, for example, 20 nm to 100 nm.

The sidewall surfaces 320W of the plurality of pattern structures 320 exposed by the plurality of hole patterns H extend in a direction substantially perpendicular to a surface 201S of the substrate 201. That is, the sidewall surface 320W may be perpendicular to the surface 201S of the substrate 201, or may form an inclination angle of 30° or less with a surface perpendicular to the surface 201S of the substrate 201.

Figure 18:
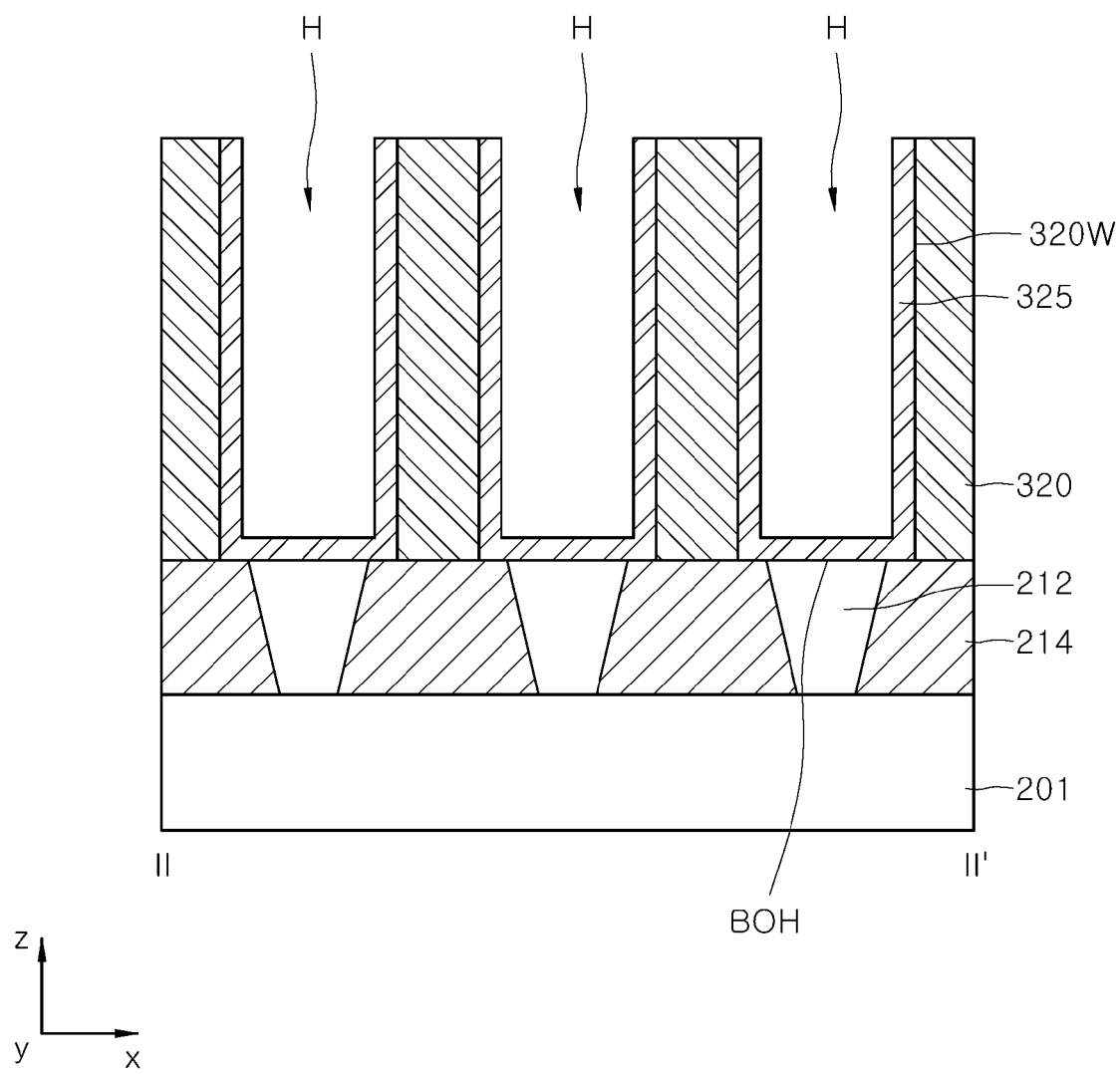

Referring to FIG. 18, a storage node electrode layer 325 is formed on the sidewall surfaces 320W and bottom surfaces of the plurality of hole patterns H. The storage node electrode layer 325 in each hole pattern H may be electrically connected to a corresponding contact plug 212. The storage node electrode layer 325 may include, for example, doped semiconductor, metal, conductive metal silicide, conductive metal nitride, and the like. As an example, the storage node electrode layer 325 may include doped silicon (Si), tungsten (W), titanium (Ti), tantalum (Ta), tungsten silicide, titanium silicide, titanium nitride, tantalum nitride, tungsten nitride, or the like.

The storage node electrode layer 325 disposed inside one hole pattern among the plurality of hole patterns H may be electrically insulated from the storage node electrode layer 325 disposed inside another adjacent hole pattern.

Figure 19:
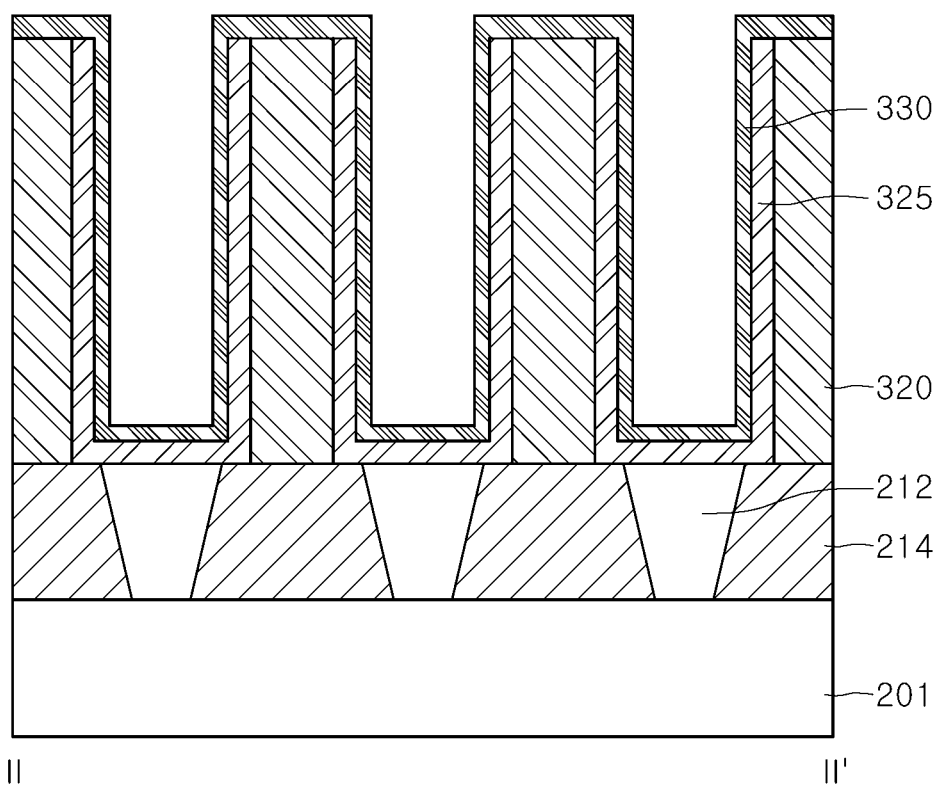

Referring to FIG. 19, an amorphous dielectric layer 330 is formed on the structure of FIG. 18. The amorphous dielectric layer 330 may be formed to cover at least the storage node electrode layer 325. A material of the amorphous dielectric layer 330 and a method of forming the amorphous dielectric layer 330 may be substantially the same as the material of the amorphous dielectric layer 230 and the method of forming the amorphous dielectric layer 230 described with reference to FIG. 9.

Figure 20:
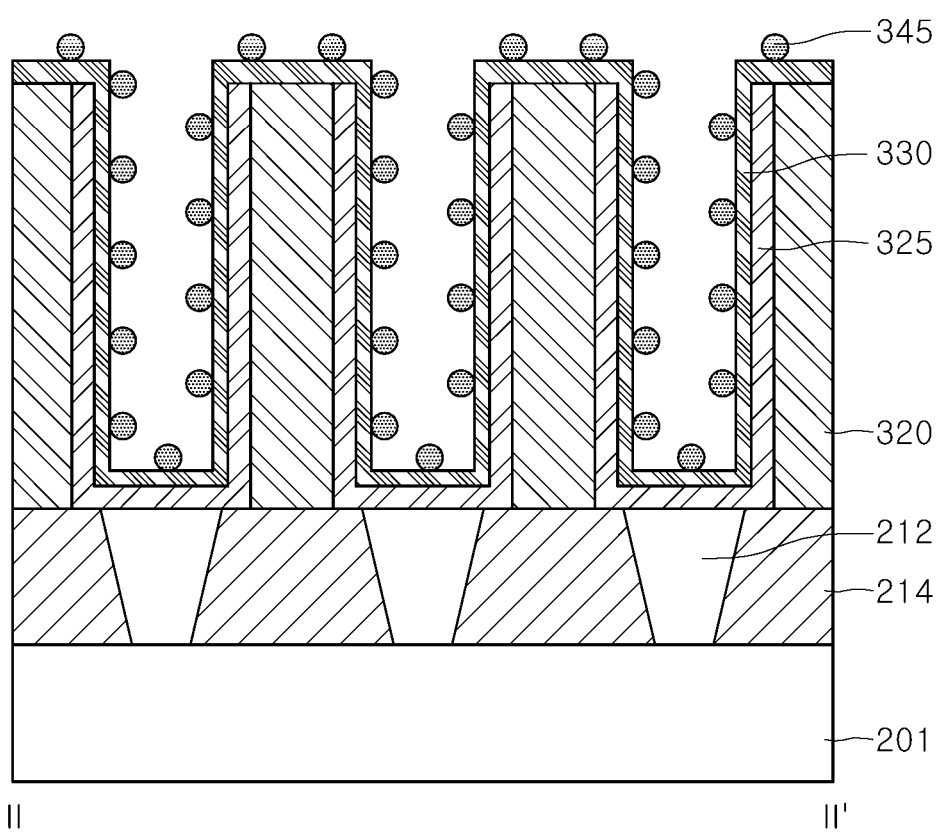

Referring to FIG. 20, a plurality of metal particles 345 are distributed on the amorphous dielectric layer 330. A material and a method of forming the plurality of metal particles 345 may be substantially the same as the material of the plurality of metal particles 245 and the method of forming the plurality of metal particles 245 described with reference to FIGS. 10 and 11.

Figure 21:
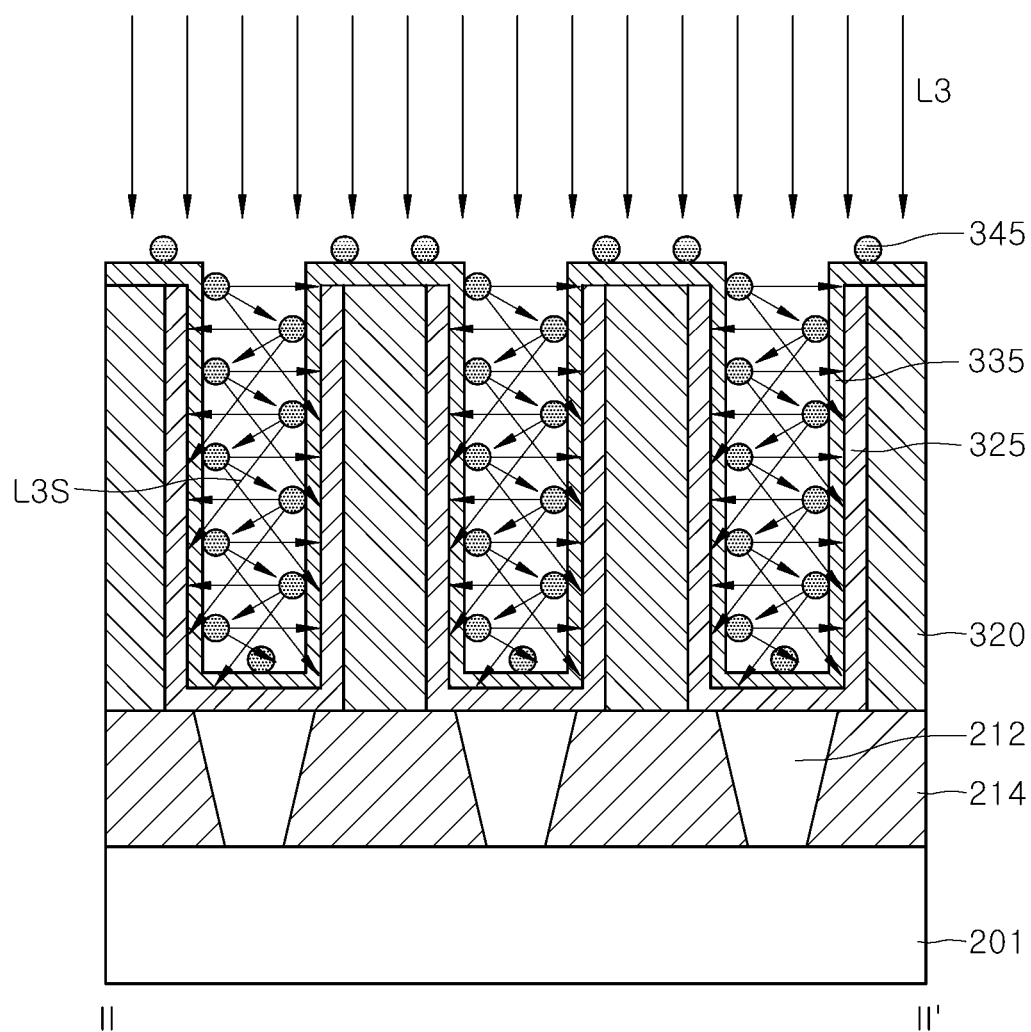

Referring to FIG. 21, a crystalline dielectric layer 335 may be formed by thermally treating the amorphous dielectric layer 330 of FIG. 20 using laser light L3. The process of thermally treating the amorphous dielectric layer 330 may be performed as a process of irradiating the laser light L3 to the amorphous dielectric layer 330 from an upper side of the plurality of pattern structures 320. The irradiated laser light L3 may be scattered from the plurality of metal particles 345.

In an embodiment, the process of irradiating the laser light L3 may include irradiating the laser light L3 in a direction substantially parallel to the sidewall surfaces 320W of the plurality of pattern structures 320. In an embodiment, the process of irradiating the laser light L3 may include a process in which laser light L3S scattered from the plurality of metal particles 345 on the amorphous dielectric layer 330 positioned on one sidewall surface 320W of the hole pattern (H of FIG. 18) reaches the amorphous dielectric layer 330 positioned on the sidewall surface 320W facing the one sidewall surface 320W. Through the thermal treatment process, the amorphous dielectric layer 330 may be crystallized to form the crystalline dielectric layer 335.

Figure 22:
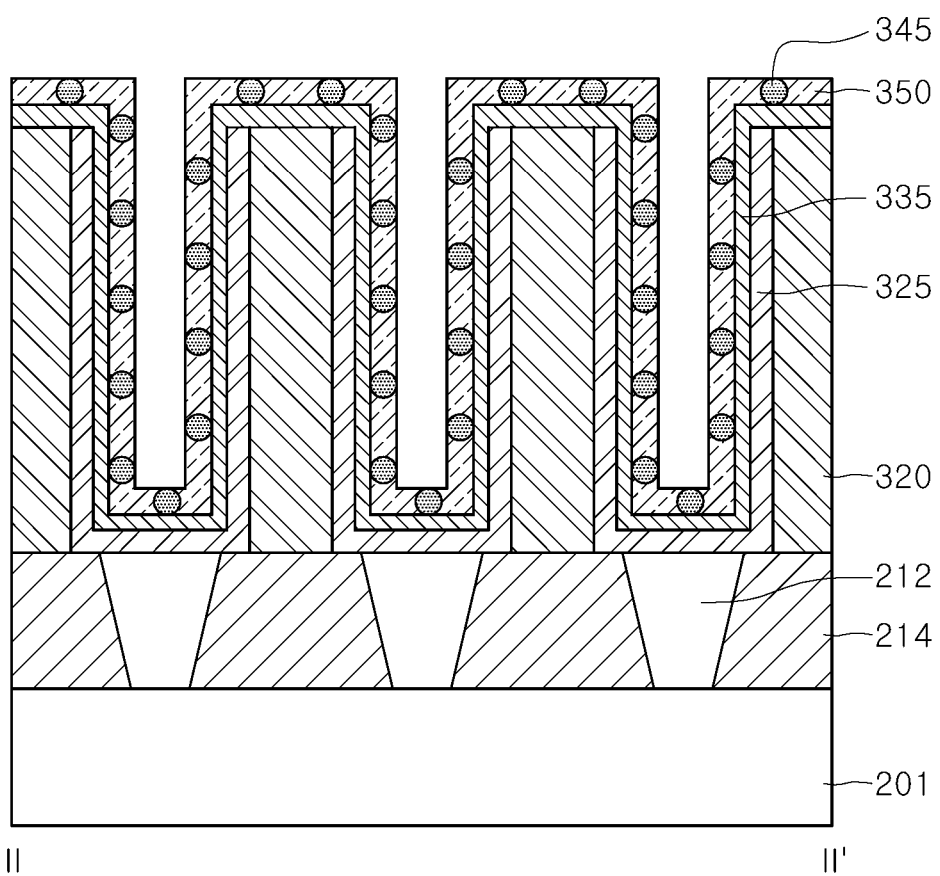

Referring to FIG. 22, a conductive layer 350 is formed on the crystalline dielectric layer 335 on which the plurality of metal particles 345 are formed. The conductive layer 350 may be formed to cover the plurality of metal particles 345 on the crystalline dielectric layer 335. A material of the conductive layer 350 and a method of forming the conductive layer 350 may be substantially the same as the material of the conductive layer 250 and the method of forming the conductive layer 250 described with reference to FIG. 13. By performing the above-described process, the semiconductor device according to an embodiment of the present disclosure may be manufactured.

Figure 23:
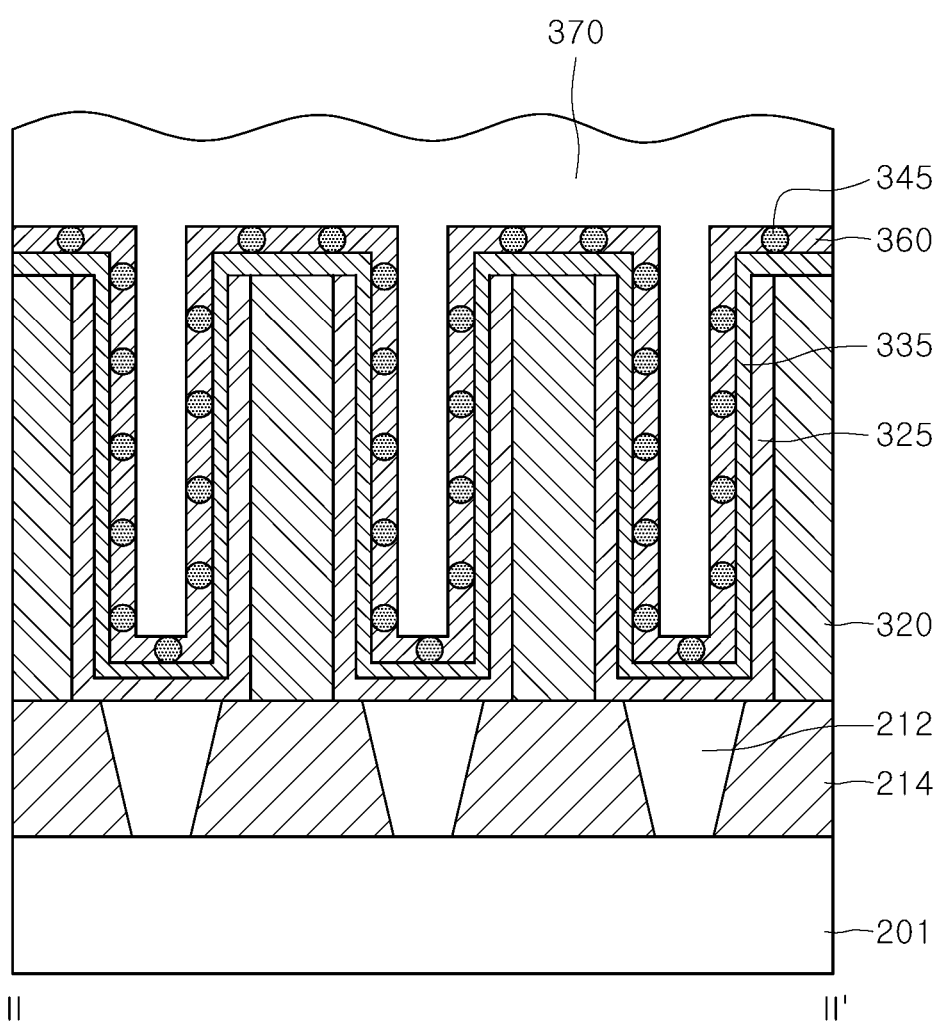

In some embodiments, as illustrated in FIG. 23, after forming the crystalline dielectric layer 335 of FIG. 21, a process of forming an upper dielectric layer 360 may be further performed. The upper dielectric layer 360 may be formed to have crystalline state by a deposition method using the crystalline dielectric layer 335 as a crystallization seed layer. A material of the upper dielectric layer 360 and a method of manufacturing the upper dielectric layer 360 may be substantially the same as the material of the upper dielectric layer 260 and the method of manufacturing the upper dielectric layer 260 described with reference to FIG. 14.

Next, a conductive layer 370 is formed on the upper dielectric layer 360. A material of the conductive layer 370 and a method of forming the conductive layer 370 may be substantially the same as the material of the conductive layer 270 and the method of forming the conductive layer 270 described with reference to FIG. 15. By performing the above-described process, a semiconductor device according to another embodiment of the present disclosure may be manufactured.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of treating a target film, the method comprising:
   providing a plurality of pattern structures with sidewall surfaces facing each other;
   forming a target film on the sidewall surfaces of the plurality of pattern structures;
   distributing a plurality of nanoparticles on the target film; and
   thermally treating the target film by irradiating laser light from upper sides of the plurality of pattern structures to the target film,
   wherein irradiating the laser light is performed in a direction substantially parallel to the sidewall surfaces of the plurality of pattern structures and the irradiated laser light is scattered from the plurality of nanoparticles to form a scattered laser light such that the scattered laser light thermally treats the target film while reciprocating between the sidewall surfaces of the plurality of pattern structures.

2. The method of claim 1, wherein providing the plurality of pattern structures comprises forming a plurality of pillar structures spaced apart from each other at predetermined spaces on a support structure.

3. The method of claim 2, wherein each of the plurality of pillar structures is disposed within a space of 20 nm to 100 nm from neighboring pillar structures.

4. The method of claim 2, wherein forming the target film comprises forming an amorphous film on the sidewall surfaces of the plurality of pillar structures on the support structure.

5. The method of claim 1, wherein distributing the plurality of nanoparticles on the target film comprises:
   forming a metal film on the target film to have a thickness of 0.1 nm to 1 nm; and
   forming the plurality of nanoparticles having a size of 0.1 nm to 5 nm by self-aggregation of the metal film.

6. The method of claim 1, wherein irradiating the laser light comprises irradiating the laser light in a direction substantially parallel to the sidewall surfaces.

7. The method of claim 1, wherein irradiating the laser light comprises allowing laser light scattered from the plurality of nanoparticles positioned on a sidewall surface of one pattern structure to reach the target film disposed on a sidewall surface of another pattern structure facing the one pattern structure.

8. A method of treating a target film, the method comprising:
providing a plurality of pattern structures with sidewall surfaces facing each other;
forming a target film on the sidewall surfaces of the plurality of pattern structures;
distributing a plurality of nanoparticles on the target film; and
irradiating laser light from upper sides of the plurality of pattern structures to the target film,
wherein irradiating the laser light is performed in a direction substantially parallel to the sidewall surfaces of the plurality of pattern structures and the irradiated laser light is scattered from the plurality of nanoparticles distributed along the sidewall surfaces such that the scattered laser light thermally treats the target film.

9. The method of claim 8, wherein providing the plurality of pattern structures comprises forming a plurality of pillar structures spaced apart from each other at predetermined spaces on a support structure.

10. The method of claim 9, wherein each of the plurality of pillar structures is disposed within a space of 20 nm to 100 nm from neighboring pillar structures.

11. The method of claim 9, wherein forming the target film comprises forming an amorphous film on the sidewall surfaces of the plurality of pillar structures on the support structure.

12. The method of claim 8, wherein distributing the plurality of nanoparticles on the target film comprises:
forming a metal film on the target film to have a thickness of 0.1 nm to 1 nm; and
forming the plurality of nanoparticles having a size of 0.1 nm to 5 nm by self-aggregation of the metal film.

13. The method of claim 8, wherein irradiating the laser light comprises irradiating the laser light in a direction substantially parallel to the sidewall surfaces.

14. The method of claim 8, wherein irradiating the laser light comprises allowing laser light scattered from the plurality of nanoparticles positioned on a sidewall surface of one pattern structure to reach the target film disposed on a sidewall surface of another pattern structure facing the one pattern structure.

* * * * *